United States Patent [19]

Sayles, Sr.

[11] Patent Number: 4,980,225

[45] Date of Patent: * Dec. 25, 1990

[54] CONDUCTIVE COMPOSITION AND METHOD OF USE

[75] Inventor: Delbert E. Sayles, Sr., Omaha, Nebr.

[73] Assignee: Sayles & Scheel Enterprises, Incorporated, Council Bluffs, Iowa

[*] Notice: The portion of the term of this patent subsequent to Jul. 14, 2004 has been disclaimed.

[21] Appl. No.: 451,504

[22] Filed: Dec. 14, 1989

Related U.S. Application Data

[62] Division of Ser. No. 218,543, Jul. 12, 1988, Pat. No. 4,929,390.

[51] Int. Cl.$^5$ .............................................. C23C 26/00
[52] U.S. Cl. .................................... 428/208; 427/123; 427/125
[58] Field of Search ................. 427/123, 125; 428/208

[56] References Cited

U.S. PATENT DOCUMENTS

| | | | |
|---|---|---|---|
| 3,848,073 | 11/1974 | Simons et al. | |
| 4,039,721 | 8/1977 | Weitze | 427/125 |
| 4,230,493 | 10/1980 | Felten | |
| 4,235,944 | 11/1980 | Felten | |
| 4,358,474 | 11/1982 | Nakano | 427/123 |
| 4,391,742 | 7/1983 | Steigerwald et al. | 252/512 |
| 4,446,059 | 5/1984 | Eustice | 252/514 |
| 4,508,754 | 4/1985 | Stepan | |
| 4,554,562 | 11/1985 | Afzali-Ardakani | 427/123 |
| 4,564,723 | 1/1986 | Lang | |
| 4,623,482 | 11/1986 | Kuo et al. | |
| 4,625,261 | 11/1986 | Weeks et al. | |
| 4,680,138 | 7/1987 | Sayles | 252/510 |
| 4,681,778 | 7/1987 | Young | |
| 4,685,030 | 8/1987 | Reyes et al. | |
| 4,765,929 | 8/1988 | Shaffer | 252/511 |
| 4,929,390 | 5/1990 | Sayles | 252/510 |

OTHER PUBLICATIONS

GC-Thorsen Specification Sheet #35.
Kraus, Manual Of Nitrocellulose Lacquers, Part I, Solvents, pp. 81 and 196 (1955).
DuPont Electronics "Conductive Silver Compositions For Air-Dry and Thermoset Applications" Data Sheet.
DuPont Electronics "Conductive Silver Compositions For Fired-On Applications" Data Sheet.
DuPont Informational Sheet: "Conductive Silver Compositions—Air-Dry And Thermoset".

*Primary Examiner*—Shrive Beck
*Assistant Examiner*—Vi Duong Dang
*Attorney, Agent, or Firm*—Leydig, Voit & Mayer

[57] ABSTRACT

An electrically conductive composition comprising an electrically conductive metal, butyl acetate, toluene, and carbon which may be applied to a substrate to form an electrically conductive coating or path thereon of improved electrical resistance and when heat treated exhibits even lower electrical resistance.

24 Claims, No Drawings

CONDUCTIVE COMPOSITION AND METHOD OF USE

This is a divisional of U.S. patent application Ser. No. 07/218,543, filed on July 12, 1988, which issued on May 29, 1990 as U.S. Pat. No. 4,929,390.

This invention is in the field of conductive composition and pertains to a composition which when applied to a substrate forms an electrically conductive coating or path thereon and a method for applying such a coating.

BACKGROUND OF THE INVENTION

The use of conductive compositions to form electrically conductive coatings or paths on substrates is well known. These conductive compositions are applied to various surfaces including circuit boards, glass, ceramics, and the like.

A conductive composition marketed by G-C Electronics of Rockford, Ill., for use on circuit boards consists of 42 wt. % silver, 25 wt. % butyl acetate, and 33 wt. % methyl methacrylate.

U.S. Pat. No. 4,391,742 discloses a paste composition for the production of electrically conductive and solderable structures, wherein the paste comprises 12-40 wt. % organic curable polymer binder, 40-70 wt. % metal salt particles, up to 3 wt. % non-ionic or anionic active wetting agent, and up to 20 wt. % reducing agent. The paste is applied to a non-conductive substrate such as a hard paper substrate by screen printing and cured at a temperature of about 175°-230° C. The polymer binding agent is thermoplastic at the curing temperature, and while the binder is in a softened state at the elevated temperature and before cross-linking is effected, the metal salt particles are carried to the surface of the polymer and become concentrated. After curing of the binder is completed, the composition is exposed to a metallizing bath. The metal salt particles located at or near the surface of the binder are dissolved in the metallizing bath, and metal is deposited in the binder pores formed by the dissolved salts. The thus-obtained metal coating is purported not to serve primarily to produce the electrical conductivity of the conductive path but rather to obtain solderability of the electrical structure. The actual electrical conductivity of the conductive path is said to be determined by the metal particles dispersed in the binder.

U.S. Pat. No. 4,446,059 discloses a conductor composition and conductive element utilizing the composition. The composition comprises 60-98.5 wt. % conductive metal, 1-20 wt. % inorganic binder, 0.5-20 wt. % colorant which is a mixture of an oxide of or a precursor of an oxide of copper, silver, or mixtures thereof and $B_2O_3$ or a precursor thereof. The conductor composition is printed onto a substrate by dispersing the composition in an organic medium and using conventional screen printing techniques. The substrate is generally soda-lime window glass, although any glass or ceramic can purportedly be used. The printed pattern is dried at 150° C. for 15 minutes, and the printed substrate is then fired in a box furnace at 600°-700° C. for 7 minutes to effect volatilization of the organic medium and sintering of the inorganic binder, conductive phase, and colorant.

BRIEF SUMMARY OF THE INVENTION

It is an object of the present invention to provide an improved conductive composition which may be applied to a variety of substrates to form electrically conductive paths thereon.

It is a further object of this invention to provide a method of utilizing the conductive composition of this invention to provide an electrically conductive path of lower electrical resistance.

These and other objects and advantages of this invention, as well as additional inventive features, will become apparent from the description which follows.

The present invention is predicated in part on the discovery that a conductive composition comprising an electrically conductive metal such as silver, gold, aluminum, or mixtures thereof, butyl acetate, toluene, and carbon may be applied to a substrate to form an electrically conductive coating or path. The conductive composition may contain a lower concentration of electrically conductive metal and exhibits reduced resistance, faster drying, improved electrical contact, and easier removal without substrate damage as compared with other conductive compositions.

Moreover, when the inventive composition is used to form an electrically conductive coating or path and the coating or path is exposed to an elevated temperature, the resulting heat-treated coating or path exhibits reduced electrical resistance over such a conductive coating or path that has not been heat-treated.

DETAILED DESCRIPTION OF THE INVENTION

While the invention will be described in connection with certain preferred embodiments, it is not intended to limit the invention to the particular embodiments. On the contrary, it is intended to cover all alternatives, modifications, and equivalent processes as may be included within the spirit and scope of the invention as defined by the appended claims.

The present invention constitutes an electrically conductive composition and a method of utilizing the composition to form an electrically conductive coating or path on a substrate.

The electrically conductive composition of the present invention comprises electrically conductive metal, butyl acetate, toluene, and carbon. The electrically conductive metal may be any suitable metal and preferably is silver, gold, aluminum, or mixtures thereof, most preferably silver or a mixture of silver and aluminum. The electrically conductive metal is preferably present in the composition in a concentration of about 10-40 wt. %, most preferably 10-30 wt. %. At the lower end of this conductive metal concentration range, plural coats or a single thick coat of the composition may need to be applied to a substrate to obtain the desired conductive coating thereon, while at the higher conductive metal concentration a single thinner coat may be sufficient. The butyl acetate is preferably present in the composition in a concentration of about 10-60 wt. %, and the toluene concentration in the composition is preferably about 5-40 wt. %, most preferably about 10-20 wt. %. The concentration of carbon in the inventive composition is preferably about 1-50 wt. % and most preferably about 10-30 wt. %.

The electrically conductive composition of the present invention also may include other components such as carriers other than butyl acetate and toluene and suitable binding agents. The present inventive composition preferably contains methyl methacrylate as a binding agent in a concentration of about 10-40 wt. %, most preferably 20-30 wt. %.

Similar compositions are disclosed in U.S. Pat. No. 4,680,138 issued to the present inventor. It has been found, however, that such compositions containing carbon can be used to prepare electrically conductive coatings or paths on substrates which exhibit reduced electrical resistance compared to coatings or paths prepared using conventional compositions.

The present inventive electrically conductive composition can be applied to a variety of substrates such as circuit boards, glass, ceramics, and the like to form an electrically conductive coating or path thereon. The composition can be applied to a substrate by any suitable means, including screen printing techniques or painting. The resulting electrically conductive coating or path may be utilized in numerous applications, such as in printed circuit boards, to repair broken electrical contacts, and as the electrical conduit in window defrosters. These uses are practical with the present inventive composition despite the reduced electrically conductive metal concentration that may be present in the inventive composition as compared to previous conductive compositions.

The inventive composition drying time at room temperature is on the order of about 60–90 seconds, less than the commercially available butyl acetate carrier conductive composition discussed above. The dried conductive coating can also be removed from certain substrates, such as film, if desired, by the use of solvents without film damage.

It has further been discovered that a coating or path formed by use of the electrically conductive composition of the present invention and subjected to an elevated temperature results in an electrically conductive coating or path of even lower electrical resistance. Best results have been obtained when the applied composition is heated at 200°–315° C. for up to one hour, preferably at 200°–230° C. for 10–35 minutes, though the preferred heating conditions also depend on the nature of the substrate to which the composition has been applied.

The following examples further illustrate the present invention but, of course, should not be construed as in any way limiting its scope.

EXAMPLE 1

An illustrative conductive composition of the present invention was prepared by adding toluene and carbon to a conventional conductive composition marketed by G-C Electronics of Rockford, Ill., consisting of 42 wt. % silver, 25 wt. % butyl acetate, and 33 wt. % methyl methacrylate. Specifically, about 1.0 ml (0.87 g) toluene and 1.2 g carbon black were added to 0.85 ml (4.1 g) of the conventional composition and thoroughly mixed to form a composition of the present invention. The present inventive composition was determined to comprise about 28 wt. % silver, 17 wt. % butyl acetate, 22 wt. % methyl methacrylate, 14 wt. % toluene, and 19 wt. % carbon.

EXAMPLE 2

This example illustrates the use of the present inventive composition to obtain electrically conductive paths on a substrate.

The composition of Example 1 was applied in two parallel strips along the 3'4" length of a 2" by 4" wooden board and allowed to air dry at room temperature to form electrically conductive paths. At one end of the board, a 110 volt AC fan, a 25 watt light bulb, and a reflective spot lamp were connected in parallel by conventional wires to the two parallel electrically conductive paths formed on the board. At the other end of the board, household current from a 110 volt source was applied to the opposite ends of the two parallel electrically conductive paths. The fan, bulb, and lamp all functioned properly. This circuit was operated for 230 non-continuous hours without any problem. There was no discoloration of the electrically conductive paths nor any noticeable heat dissipation.

EXAMPLE 3

This example illustrates the use of the present inventive composition to repair broken circuits on a circuit board.

The composition of Example 1 was used to repair 75 broken circuits in a television circuit board that had been dropped and cracked. The television functioned properly during the five month test period.

EXAMPLE 4

This example illustrates the reduced electrical resistance of electrically conductive coatings and paths obtained from application of the present inventive composition as compared to conventional compositions.

The unaltered conventional composition described in Example 1 was applied to a glass tile to form an electrically conductive path thereon. The glass tile was approximately 4 inches long, 1 inch wide, and 0.037 inch thick. The composition was applied in a series of 10 coats, one on top of the other, to form a path extending lengthwise on the glass tile from one edge of the glass tile to the other edge. The applied composition was air dried and formed an electrically conductive path approximately 4 inches long, 0.540 inch wide, and 0.003 inch in average thickness. Using a conventional ohm meter, the electrical resistance along the length of the path was determined to be 0.4 ohm.

The present inventive composition of Example 1 was applied to a similar glass tile in a sequence of 10 coats in the same manner as the conventional composition. The applied composition was air dried and formed an electrically conductive path approximately 4 inches long, 0.386 inch wide, and 0.003 inch in average thickness. The electrical resistance along the length of the path was determined to be 0.2 ohm, or 50% lower than that of the path formed using the conventional composition.

EXAMPLE 5

This example illustrates the reduced electrical resistance of electrically conductive coatings and paths obtained from application of the present inventive composition to a substrate resulting from heat-treatment of the applied composition and, further, the improved electrical resistance of paths formed using the present inventive composition without heat-treatment as compared to paths obtained from application of conventional compositions even if followed by heat-treatment of the applied composition.

The glass tiles with electrically conductive paths thereon prepared in Example 4 were heated at 200° F. for 35 minutes and allowed to cool to room temperature. The electrically resistance of the paths were then determined along the lengths of the paths.

The electrical resistance of the path formed using the conventional composition was determined to be 0.3 ohm.

The electrical resistance of the path formed using the present inventive composition was determined to be 0.1 ohm, which was half of the resistance of the non-heat-treated path formed using the present inventive composition and a third of the resistance of the heat-treated path formed using the conventional composition. Moreover, the path prepared using the present inventive composition and simply air dried in Example 4 exhibited a lower resistance than the path prepared using the conventional composition which had been heat-treated.

EXAMPLE 6

This example illustrates the reduced electrical resistance of electrically conductive coatings and paths obtained from application of the present inventive composition to a substrate followed by heat-treatment of the applied composition.

The composition of Example 1 was applied to a glass tile 3.9905 inches long, 0.9885 inch wide, and 0.0370 inch thick in a single coat extending lengthwise from one edge of the glass tile to the other edge. The applied composition was then air dried at room temperature to form an electrically conductive path 3.9905 inches long by 0.441 inch wide with an average thickness of 0.0002 inch. The electrical resistance along the length of the path was determined to be 3.0 ohms.

The glass tile with the electrically conductive path thereon was subsequently heated at 200° C. for ten minutes and then allowed to cool to room temperature. The electrical resistance along the length of the heat-treated path was determined to be 1.6 ohms. The heat-treatment resulted in a nearly 50% reduction in resistance over the room temperature air dried conductive path.

EXAMPLES 7–11

These examples illustrate the reduced electrical resistance of electrically conductive coatings and paths obtained from application of the present inventive composition to a substrate followed by heat-treatment of the applied composition.

In each of these examples, the composition of Example 1 was applied to a glass tile in the indicated number of coats to form an electrically conductive path thereon of similar width and length. The applied composition was then air dried at room temperature or heat treated as indicated. The electrical resistance of each resulting conductive path was then determined.

| Ex. | No. Coats Composition | Heating Temp. | Time | Max. Current |
|---|---|---|---|---|
| 7 | 2 | — | — | 1.7 ohms |
| 8 | 2 | 230° C. | 35 min. | 0.1 ohm |
| 9 | 4 | 230° C. | — | 0.4 ohm |
| 10 | 3 | 230° C. | 10 min. | 0.4 ohm |
| 11 | 10 | 230° C. | 35 min. | 0.1 ohm |

These results indicate that the heat treatment of the present inventive composition applied to a substrate results in a significantly lowered resistance.

What is claimed is:

1. A method of preparing an electrically conductive coating on a substrate comprising:
   (a) applying to a substrate a conductive composition comprising an electrically conductive metal, butyl acetate, toluene, and carbon, and
   (b) drying the composition on the substrate.

2. The method of claim 1 wherein the composition is subjected to an elevated temperature after application to the substrate.

3. The method of claim 2 wherein the composition is heated at about 200°–315° C. for up to one hour after application to the substrate.

4. The method of claim 3 wherein the composition is heated at about 200°–230° C. for 10–35 minutes after application to the substrate.

5. The method of claim 4 wherein the electrically conductive metal is selected from the group consisting of silver, gold, aluminum, and mixtures thereof.

6. The method of claim 5 wherein the electrically conductive metal is present in a concentration of about 10–40 wt. %.

7. The method of claim 6 wherein the butyl acetate concentration is about 10–60 wt. %, the toluene concentration is about 5–40 wt. %, and the carbon concentration is about 1–50 wt. %.

8. The method of claim 7 wherein the composition further comprises a binding agent.

9. The method of claim 8 wherein the binding agent is methyl methacrylate and is present in a concentration of about 10–40 wt. %.

10. The method of claim 9 wherein the electrically conductive metal is silver and is present in a concentration of about 10–30 wt. %, the butyl acetate concentration is about 10–20 wt. %, the toluene concentration is about 10–20 wt. %, the carbon concentration is about 10–30 wt. %, and the methyl methacrylate concentration is about 20–30 wt. %.

11. The method of claim 1 wherein the concentration of the electrically conductive metal is about 40 wt. % or less.

12. The method of claim 11 wherein the electrically conductive metal is silver.

13. The method of claim 12 wherein the composition further comprises a binding agent.

14. The method of claim 13 wherein the binding agent is methyl methacrylate.

15. The method of claim 1 wherein the electrically conductive metal is present in a concentration of about 10–40 wt. %.

16. The method of claim 15 wherein the butyl acetate concentration is about 10–60 wt. %.

17. The method of claim 16 wherein the toluene concentration is about 5–40 wt. %.

18. The method of claim 17 wherein the carbon concentration is about 1–50 wt. %.

19. The method of claim 18 wherein the composition further comprises a binding agent.

20. The method of claim 19 wherein the binding agent is present in a concentration of about 10–40 wt. %.

21. The method of claim 20 wherein the binding agent is methyl methacrylate.

22. A substrate containing an electrically conductive path formed from a composition comprising about 10–40 wt. % electrically conductive metal selected from the group consisting of silver, gold, aluminum, and mixtures thereof, about 10–60 wt. % butyl acetate, about 5–40 wt. % toluene, and 1–50 wt. % carbon.

23. The substrate of claim 22 wherein the composition further comprises 10–40 wt. % methyl methacrylate.

24. The substrate of claim 23 wherein the electrically conductive path is formed by subjecting the composition to an elevated temperature after application to the substrate.

* * * * *